United States Patent [19]

Okada et al.

[11] Patent Number: 5,318,948
[45] Date of Patent: Jun. 7, 1994

[54] OXIDE SUPERCONDUCTOR, SUPERCONDUCTING WIRE AND COIL USING THE SAME AND METHOD OF PRODUCTION THEREOF

[75] Inventors: Michiya Okada, Mito; Ryou Nishiwaki; Yoshihide Wadayama, both of Hitachi; Toshimi Matsumoto, Katsuta; Katsuzo Aihara, Hitachiota; Tomoichi Kamo; Shinpei Matsuda, both of Ibaraki; Toshihide Nabatame, Hitachiota; Yukio Saito; Toyotaka Yuasa, both of Hitachi, all of Japan

[73] Assignee: Hitachi, Ltd., Tokyo, Japan

[21] Appl. No.: 866,299

[22] Filed: Apr. 13, 1992

Related U.S. Application Data

[63] Continuation of Ser. No. 486,420, Feb. 28, 1990, abandoned.

[30] Foreign Application Priority Data

Mar. 3, 1989 [JP] Japan ............................ 1-49841
Nov. 6, 1989 [JP] Japan ........................... 1-287476

[51] Int. Cl.⁵ ............................................ H01L 39/12
[52] U.S. Cl. .................................... 505/230; 252/521; 505/704; 505/785; 505/430; 505/434
[58] Field of Search ............... 505/782, 704, 785, 740, 505/1; 252/518, 521

[56] References Cited

U.S. PATENT DOCUMENTS

| | | | |
|---|---|---|---|
| 4,885,273 | 12/1989 | Suginoto et al. | 505/1 |
| 4,906,609 | 3/1990 | Yamauchi et al. | 505/1 |
| 4,916,114 | 4/1990 | Hoenig | 505/1 |
| 4,939,121 | 7/1990 | Rybka | 505/1 |
| 4,942,151 | 7/1990 | Capone et al. | 264/63 |
| 4,952,554 | 8/1990 | Jin | 505/740 |
| 4,956,336 | 9/1990 | Salami et al. | 505/1 |
| 4,973,575 | 11/1990 | Capone | 264/108 |
| 4,975,411 | 12/1990 | Danby | 505/1 |
| 4,988,669 | 1/1991 | Dersch | 505/704 |
| 5,011,823 | 4/1991 | Jin | 505/740 |
| 5,057,484 | 10/1991 | Shiota | 505/704 |
| 5,063,200 | 11/1991 | Okada | 505/704 |
| 5,093,314 | 3/1992 | Takahashi | 505/704 |
| 5,106,825 | 4/1992 | Mandigo | 505/704 |
| 5,122,507 | 6/1992 | Yamamoto | 505/704 |

FOREIGN PATENT DOCUMENTS

0292436 5/1988 European Pat. Off. .
0308892 9/1988 European Pat. Off. .
0347770 6/1989 European Pat. Off. .

OTHER PUBLICATIONS

McCallum "Problems in the Production of $YBa_2Cu_3O_x$ Supercording Wire" *Adv. Ceramic Mat'ls* v. 2 (3B) Jul., 1987 pp. 388–400.
Kohno "Critical Temperature and Critical Current Density", *JJAP* v. 26(5) May 1987 pp. L759–L760.
Okada "Neutron Diffraction Study on Preferred . . ." *Jap. Jnl. Appl. Phys.* v. 27(9) Sep. 1988 p. 21715.
Jin "Fabrication of 91 K Superconductor Coils" *Proc. Mat'ls Res. Sol.* Apr. 21–24, 1987.
Okada, et al "Fabrication of Ag-Sheathed Ba-Y-Cu Oxide Superconductor Tape", vol. 27, No. 2, Feb. 1988-pp. L185–L187 (Feb. 1988) (Jap. Jnl. Appl. Phys. 25).

*Primary Examiner*—Paul Lieberman
*Assistant Examiner*—John Boyd
*Attorney, Agent, or Firm*—Antonelli, Terry, Stout & Kraus

[57] ABSTRACT

A high-temperature oxide superconductor is provided and comprises oxide crystals oriented in a certain direction, the oxide superconductor being substantially free of or containing a controlled amount of foreign phases, a non-superconducting phase and weak superconducting phase which are harmful for superconducting characteristics in the grains of the crystals and at the grain boundaries between the crystals. The foreign phases, if any, are finely and uniformly dispersed in the grains of the oxide crystals and at the grain boundaries. A wire made from the oxide superconductor, a coil from the wire, and a magnetic field generator from the coil are disclosed, the superconductor wire having only a single layer of oxide crystal grains in the thickness direction.

23 Claims, 10 Drawing Sheets

F I G. 16
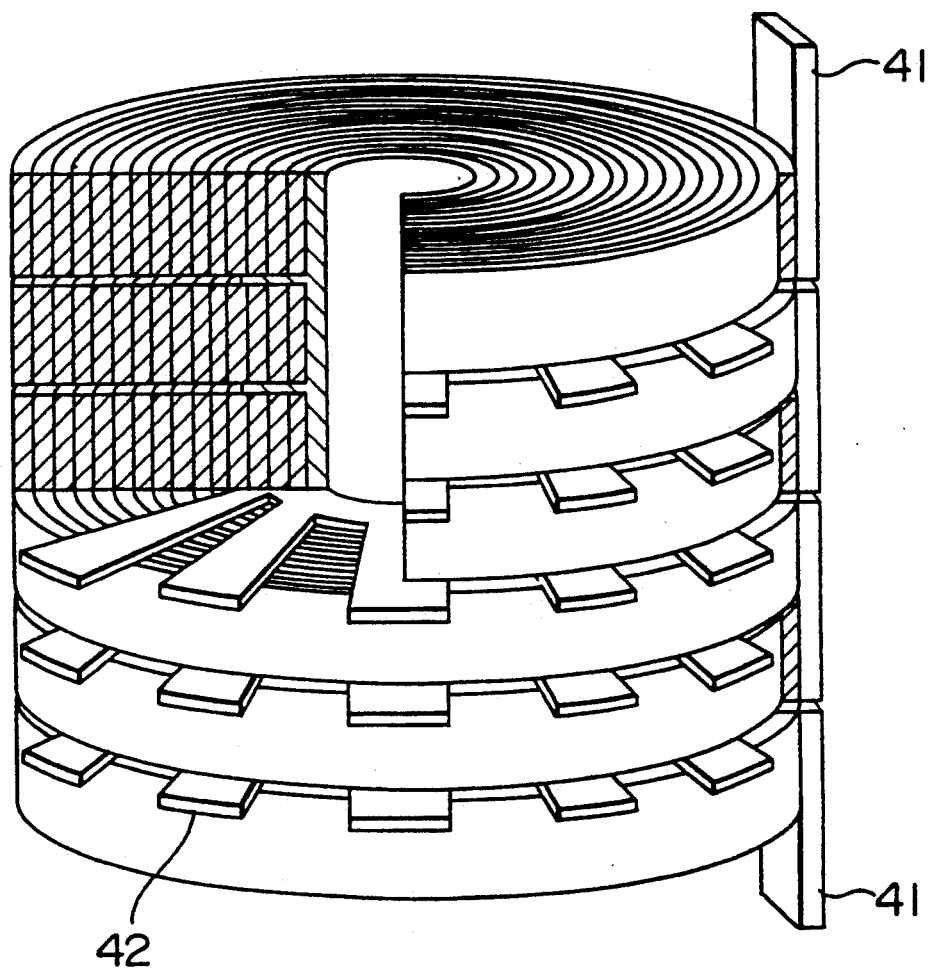

OXIDE SUPERCONDUCTOR, SUPERCONDUCTING WIRE AND COIL USING THE SAME AND METHOD OF PRODUCTION THEREOF

This application is a continuation of application Ser. No. 07/486,420, filed on Feb. 28, 1990 now abandoned.

BACKGROUND OF THE INVENTION

1. Field of the Invention

The present invention relates to a high-temperature oxide superconductor exhibiting a superconducting property when cooled with liquid helium or liquid nitrogen, a superconducting wire, a coil using the wire, and a method of producing the wire and coil, more particularly to an oxide superconductor, superconducting wire and coil having a high critical current density even in a high magnetic field.

2. Description of Related Art

Prior art high-temperature oxide superconducting wires are known to have a high critical current density of 1,000 $A/m^2$ or higher at a liquid nitrogen temperature by flattening the cross-sectional structure through such a pressing technique, such as rolling, as disclosed in Japanese Journal of Applied Physics, 1988, Vol. 27, No. 2, pp. L185 to L187 and Japanese Journal of Applied Physics, 1988, Vol. 27, No. 12, pp. L2345 to L2347.

Furthermore, Japanese Patent KOKAI (Laid-Open) No. 63-252310 discloses a method of producing a homogeneous superconductor composite tape or wire, which comprises plastically forming a composite body comprising a metal sheath and an oxide superconductor, and uniformly heating the oxide superconductor in a furnace, melting part or the whole of the oxide superconductor. In this method, however, the crystal structure of the oxide superconductor is not so changed and the critical current density is not improved in a magnetic field.

The prior art as mentioned above does not take an account of the critical current density in a magnetic field and is accompanied with such a problem that the critical current density is greatly reduced when a small amount of external magnetic field is applied.

SUMMARY OF THE INVENTION

The object of the present invention is to provide a high-temperature oxide superconductor having a high critical current density in a high magnetic field at a liquid nitrogen temperature, and a wire and coil of the superconductor.

BRIEF DESCRIPTION OF DRAWINGS

FIG. 16 is a cross-sectional view illustrating a pancake type superconducting coil using the superconducting coil according to the present invention.

DETAILED DESCRIPTION OF PREFERRED EMBODIMENTS

Figure 1:
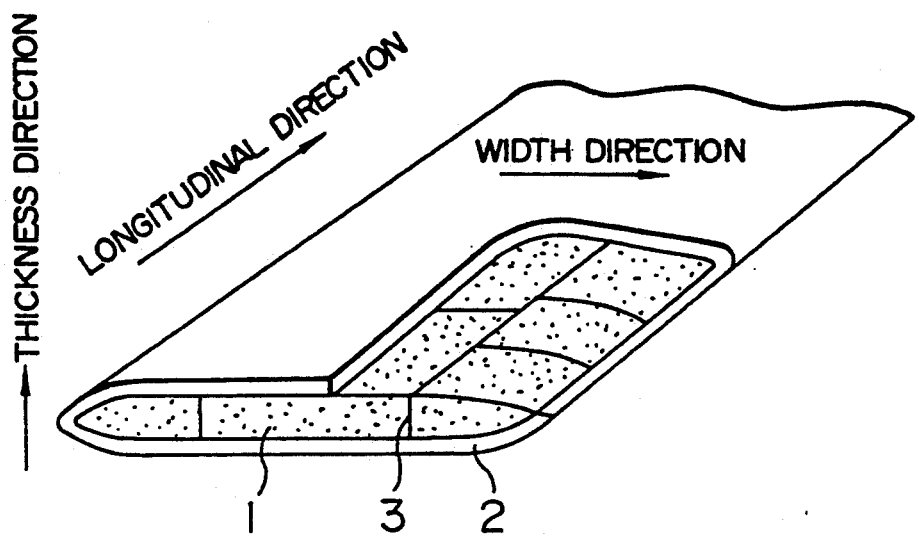
FIG. 1 is a perspective view illustrating the cross-sectional structure of a wire of the oxide superconductor for use in a high magnetic field according to the present invention.

In accordance with the present invention, the above-mentioned object can be achieved by a high temperature oxide superconductor containing a major part of the grain boundaries of the oxide crystals constituting the superconductor oriented in a longitudinal direction, the grain boundaries being firmly bonded by superconducting strong bond. The "superconducting strong bond" used herein means that at grain boundaries of oxide crystals as matrix exhibiting superconductivity there is substantially not present a non-superconducting or weak superconducting phase at all, or if any, there may be present such a phase in such a state that the critical current density is not allowed to decrease or in such a state that the phase can act as pinning points preferred for a superconductor, when cooled to the temperature of liquid helium or liquid nitrogen.

In the present invention, the "non-superconducting phase" means a phase not exhibiting superconductivity at a predetermined cooling temperature and includes not only foreign phases, but also, for example, voids, impurities and the like. Furthermore, the "weak superconductor" ("weak superconducting phase") means a phase not stabilized in superconductivity due to breaking of superconductivity in grain boundaries or in the inside of grains with a relatively weak external magnetic field (less than about 1,000 Gaus) applied thereon. For example, the weak superconducting phase includes a portion having a Josephson junction formed therein or a portion containing an improper range of carrier concentration.

In order to obtain the superconducting strong bond, for example, the size of the non-superconducting or weak superconducting phase present in grain boundaries and grains of the oxide crystal matrix is limited to 1 micron or less on average, and if possible, the surface area of the non-superconducting or weak superconducting phase is limited to 1 to 50% of the total surface area of the grain boundaries, preferably 3 to 10% for a thallium-containing oxide superconductor and 10 to 30% for a bismuth-containing oxide superconductor.

Prior art high-temperature oxide superconductors in a polycrystalline form can have only a far smaller critical current density when connected to an external electric source, i.e., the critical current density is some orders of magnitude smaller than that when measured with a magnetization method. This is because the critical current density through the grain boundaries between crystal grains is very small, although the interior of the grains has a great critical current density, in other words, because the grain boundaries are in a state of superconducting weak bond.

The weak bond appears to be caused by a non-superconducting phase or weak superconducting phase (hereinafter referred to as foreign phase), for example, defects such as pinholes, precipitates of impurities, dislocation of crystals or structural defects.

At grain boundaries there are many precipitates of foreign phases or turbulence of crystals which facilitates to form an insulating layer or non-superconducting layer. Therefore, when an electric current passes through such grain boundaries, it is a tunnel current similar to that in a Josephson junction. As a result, the critical current density of the superconductor as a whole is greatly reduced. Furthermore, this density is sharply lowered when an external magnetic field is applied.

Therefore, in order to improve the critical current density of the superconductor in a polycrystalline form, it is necessary to eliminate the weak bond at the grain boundaries. In order to eliminate the weak bond, treatments should be carried out so that the foreign phases are not precipitated and turbulence of crystals is prevented at the grain boundaries.

The foreign phase in a yttrium-containing superconductor is a $Y_2Ba_1Cu_1O_5$ phase and/or fine voids. Since these phases act as pinning points when finely dispersed in the superconductor matrix, the foreign phase are rather useful when they are suitably controlled. In this case, the size of the $Y_2Ba_1Cu_1O_5$ phase is desirably in the range of 0.01 to 1 micron.

The foreign phase in a thallium-containing superconductor is a $CaCuO_2$ or $CuO$ phase and/or fine voids. The foreign phase acts as pinning points when finely dispersed in the matrix. In this case, the size of the $CaCuO_2$ or $CuO$ phase is desirably in the range of 0.01 to 50 microns.

Furthermore, in a bismuth-containing oxide superconductor, the fine $CaPbO_4$ phase and/or the fine voids act as pinning points.

In any of the cases above, it has been found that the flux pinning in the oxide superconductor is made possible, and the critical current density at 77 K. and 1T is at least two times or five times to ten times greater than that of prior art superconductors of the same type.

In accordance with our experiments, when the non-superconducting or weak superconducting phase is finely and uniformly dispersed in the oxide matrix as mentioned above, these foreign phases are effective for pinning the quantized flux. Therefore, if these foreign phases are finely and uniformly dispersed in the oxide matrix, they are rather preferred for the superconductors even if they are not entirely eliminated.

The oxide superconductors in accordance with the present invention, which contain as a less amount of the foreign phases as possible dispersed finely and uniformly in the oxide matrix thereof, can be produced by pressing materials for the high-temperature oxide superconductors to form a densified compact, heating the compact at one side thereof to melt part or the whole of the compact, if possible, while transferring the compact in some direction to prevent the foreign phases from being formed. In one embodiment, oxide powders are filled in a metal sheath and plastically worked by a rolling mill to prepare a wire of flat cross section. The wire is locally heated by a light-concentration heating method uniformly in a traverse or cross-sectional direction and with a large gradient of temperature in a longitudinal direction, while transferring the wire in a longitudinal direction.

Alternatively, the wire having a flat cross sectional contour may be formed by depositing materials for the high-temperature oxide superconductors onto a ceramic substrate or metal substrate through the laser deposition, sputtering, plasma spraying, CVD or screen printing. The wire is heated by a local light-concentration heating method uniformly in a cross-sectional direction and with a large gradient of temperature in a longitudinal direction, while transferring the wire in a longitudinal direction.

In the crystallographical aspect of the oxide superconductor according to the present invention, the oxide crystals are bonded to the adjacent ones through the c-axis. The angle of the c-axis of the adjacent crystals may be deviated to a small extent if it is below 5°. The thickness of the oxide crystals is preferably in the range of 2 $\mu$m or more to 500 $\mu$m or less, most preferably 10 to 100 $\mu$m.

The oxide superconductors may be deposited on a substrate. As this substrate may be used a metal substrate or ceramic substrate. Other materials may also be used.

The superconductor is preferably a composite body comprising ah oxide superconductor and metal body integrated together. The metal body is, for example, a metal pipe or a metal plate. The metal is selected from highly electrically conductive materials which are non-oxidizing or substantially non-reactive with materials for oxide superconductors at the heat-treatment temperature which is higher than the melting point of the oxide superconductors, e.g., 960° to 1,100° C. for Y-and lanthanoid elements-containing superconductors, 850° to 950° C. for Tl-containing superconductors, and 825° to 925° C. for Bi-containing superconductors. It includes gold, silver, palladium or alloys thereof, or copper-8% aluminum alloy.

The metal substrate may be made of silver, gold, palladium or alloys of two or more thereof.

The ceramic substrate is preferably made of magnesia, yttria, stabilized zirconia or the like.

As materials for the oxide superconductors may be used known various materials in the present invention. Preferable oxide superconductors are represented by the general formulae, i.e., $(Tl_{1-x_1}\text{-}Pb_{x_2})_{l_1}\text{-}(Ba_{1-y_1}\text{-}Sr_{y_1})_{b_1}\text{-}Ca_{c_1}\text{-}Cu_{d_1}\text{-}O_{3_1}$, wherein $x_1$ and $y_1$ is 0 to 0.5; $a_1$, $b_1$, $c_1$ and $d_1$ are each 1.8 to 2.2; $e_1$ is 8 to 10; and $a_1+b_1+c_1+d_1$ is 9 or less; $(Bi_{1-x_2}\text{-}Pb_{x_2})_{a_2}\text{-}Sr_{b_2}\text{-}Ca_{c_2}\text{-}Cu_{d_2}\text{-}O_{3_2}$, wherein $X_2$ is 0 to 0.5; $a_2$, $b_2$, $c_2$ and $d_2$ are each 1.8 to 2.2; $e_2$ is 8 to 10; and $a_2+b_2+c_2+d_2$ is 9 or less; and $Y_{a_3}\text{-}Ba_{b_3}\text{-}Cu_{c_3}\text{-}O_{d_3-\delta}$, wherein Y is at least one element selected from yttrium and lanthanoid elements; $a_3$, $b_3$ and $c_3$ are each 1.8 to 2.2; $a_3+b_3+c_3$ is 7 or less; $\delta$ is 0 to 0.5. For example, reference may be made to a $Tl_a\text{-}Ba_b\text{-}Ca_c\text{-}Cu_d\text{-}O_3$ system, wherein (1) $a:b:c:d:e=2:2:2:3:10$, (2) $a:b:c:d:e=2:2:1:2:8$ and (3) $a:b:c:d:e=2:2:0:1:6$ are particularly useful; $Tl_a\text{-}(Ba_{1-x},Sr_x)_b\text{-}Ca_c\text{-}Cu_d\text{-}O_3$ system, wherein (1) $a:b:c:d:e=2:2:2:3:10$, (2) $a:b:c:d:e=2:2:1:2:8$ and (3) $a:b:c:d:e=2:2:0:1:6$, $x=0$–$0.5$ are particularly useful; $(Tl_{1-x},Pb_x)_a\text{-}Ba_b\text{-}Ca_c\text{-}Cu_d\text{-}O_3$ system, wherein (1) $a:b:c:d:e=2:2:2:3:10$, (2) $a:b:c:d:e=2:2:1:2:8$ and (3) $a:b:c:d:e=2:2:0:1:6$, $x=0$–$0.5$ are particularly useful; $Y_a\text{-}Ba_b\text{-}Cu_c\text{-}O_d$ system, wherein (1) $a:b:c:d=1:2:3:7-\delta$ and (2) $a:b:c:d=1:2:4:8-\delta$ are particularly useful; $(Bi_{1-x},Pb_x)_a\text{-}Sr_b\text{-}Ca_c\text{-}Cu_d\text{-}O_3$ system, wherein (1) $a:b:c:d:e=2:2:2:3:10$, (2) $a:b:c:d:e=2:2:1:2:8$, (3) $a:b:c:d:e=2:2:0:1:6$, $x=0$–$0.5$ are particularly useful, and the like.

The cause for greatly lowering the critical current density of the oxide superconductor in a magnetic field is that the bond between crystals at the grain boundaries is weak, as mentioned above.

Since the grain boundaries of the high-temperature oxide superconductors according to the present invention are constituted by the c-plane of crystal which is the electrically conductive plane of the oxide superconductor, no weak bond is formed at the grain boundaries. That is, since the c-plane of the crystals of the oxide superconductors in the wire of the present invention is bonded to the c-plane of the adjacent crystals at the grain boundaries, a high critical current density can be reached in a magnetic field.

In a method of producing an oxide superconductor wire comprising a metal sheath and an oxide superconductor and having a flattened cross-sectional structure, part or the whole of the wire is molten in a heating zone in which the wire is locally heated uniformly in the traverse direction of the wire or tape and with a great gradient of temperature in the longitudianl direction, while transferring the heating zone in the longitudinal direction. This method makes it possible to prepare a long wire having the flat planes of the flat oxide crystals oriented in parallel with the wide plane of the wire or tape. That is, since the oxide crystals are molten and oriented as being in contact with the metal sheath, a long, uniform wire of the oxide superconductor having a high density, high orientation and large crystal size can easily be obtained.

Figure 17:
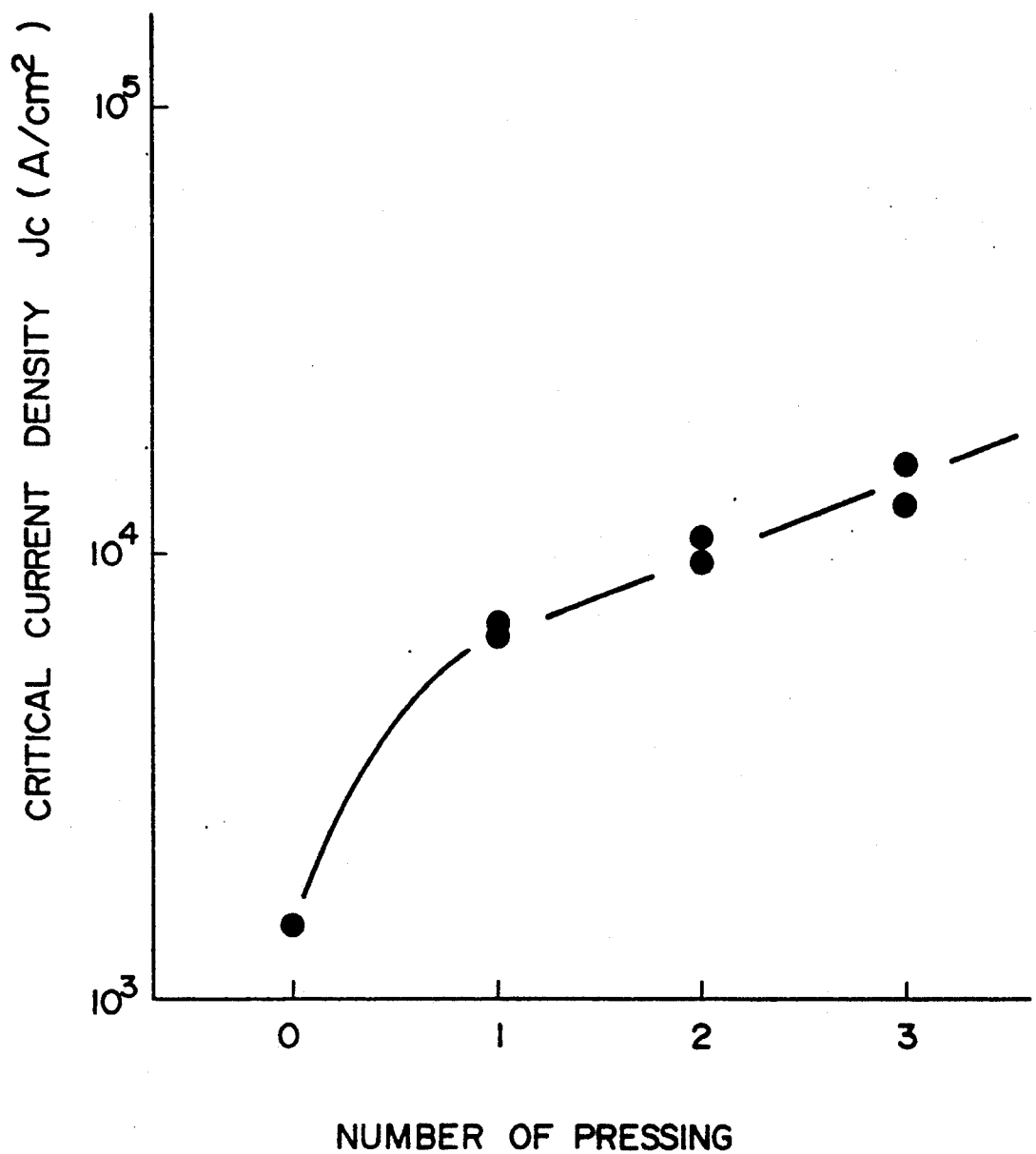
FIG. 17 is a graph showing the relationship between the number of pressing in plastic working and the critical current density of the resulting wire.

After filling a metal tube with oxide powders as raw materials for the oxide superconductor, these powders are densified with a press machine or the like. The relationship between the number of pressing and the critical current density of the resulting superconductor is as shown in FIG. 17. It is seen from this figure that as the number of pressing is increased, the packing density of the powders is increased, which prevents the formation of the foreign phases or causes the refining of the foreign phases in the subsequent locally heating step. For this reason, the critical current density of the superconductor is remarkably improved. The oxide superconductors of the present invention can be produced by subjecting a heat treatment of a compact of the superconductor powder which has an increased density after plastic working or pressing by means of a rolling mill or pressing machine. After the plastic working of the compact, its density can be increased to 80% or more of the theoretical density of the powder, and after the heat treatment of the compact, the density becomes about 95% or more of the theoritical density of the powder.

The wire prepared by the method of the present invention has the excellent three properties, orientability, density and crystal size, which are not possessed by the prior art superconductor wire. At the same time have been eliminated some causes for lowering the critical current density Jc in a magnetic field, such as disordered arrangement of oxide crystals or Josephson weak bond at grain boundaries.

When an electric current is allowed to flow through a coil made of the oxide superconductor to generate a magnetic field, the intensity and direction of the magnetic field vary depending upon the positions in the coil.

In an example of a cylindrical solenoid coil, the intensity of the magnetic field is maximum at the center of the undermost layer of the coil and the intensity is reduced at the outer side or end side of the coil. The magnetic field near the center is in an axial direction but in a radial direction near the end side.

In the oxide superconductor there is a dependency of the critical current density upon the direction of magnetic field, which is contributed to by the crystal structure thereof. According to the study of the relationship between the critical current density of a tape-shaped wire of a Bi-Sr-Ca-Cu-0 system oxide superconductor and a magnetic field, it has been found that when the magnetic field is normal to the plane of the tape, the critical current density is more greatly reduced than when the magnetic field is in parallel with the plane. Therefore, in a coil made of such a tape-shaped wire as mentioned above, the magnetic field component normal to the plane of tape is so large at the end of the coil that the critical current density is reduced and no magnetic field can effectively be generated.

The present invention will be illustrated below with reference to some examples and the drawings.

EXAMPLE 1

An example of the high-temperature oxide superconductor wire is shown in FIG. 1.

This wire had a flat shape in cross section, and it was comprised of oxide superconductor crystals 1 of $Y_1Ba_2Cu_2O_{7-\delta}$, wherein $\delta$ is 0.5 or less, covered with a gold-5 wt % palladium alloy sheath 2. The sheath 2 may be any of gold, silver and palladium or an alloy thereof. Grain boundaries 3 were present only in the longitudinal direction of the wire and absent in the direction of thickness of the wire. Furthermore, the crystals were bonded to each other at the c-plane thereof and at the grain boundaries. The critical current density Jc at 77 K. and 1T of the wire was 10,000 A/cm$^2$ or more at a wire core thickness of 0.1 mm. The Jc was measured by a four-terminal resistance method and defined as being a current when a voltage of 1 $\mu$V was generated at a distance of 1 cm between the terminals. This method and these conditions were used also in the other examples below.

EXAMPLE 2

Figure 2:
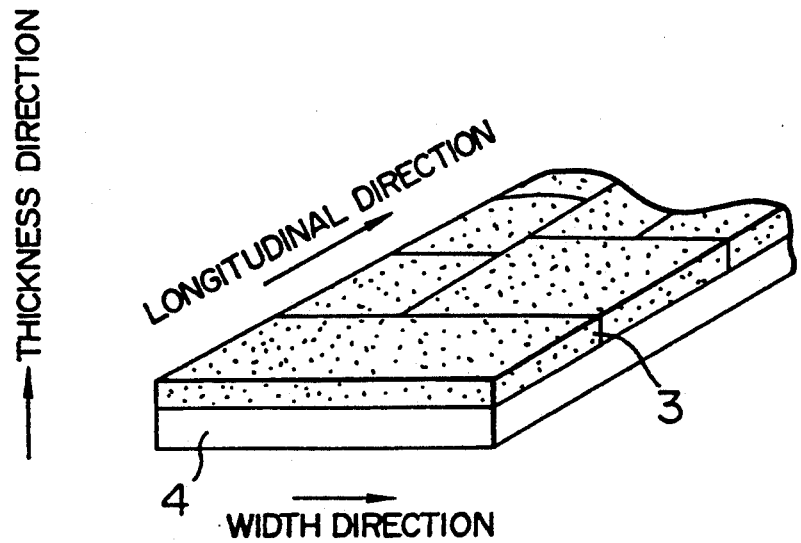
FIG. 2 is also a perspective view illustrating the cross-sectional structure of a wire of the oxide superconductor for use in a high magnetic field according to the present invention.

This example concerns a wire comprising an oxide superconductor deposited on a ceramic substrate, as shown in FIG. 2. Substrate 4 used was of an MgO (100) single crystal. Substrate 4 may be of a ceramic such as stabilized zirconium. The oxide superconductor crystals 1 were of $Tl_2Ba_2Ca_2Cu_3O_{10}$. Grain boundaries 3 were present only in the longitudinal direction and width direction of the wire and absent in the direction of thickness of the wire, which was similar to the state as shown in EXAMPLE 1. Furthermore, the crystals were bonded to each other at the c-plane thereof and at the grain boundaries. The critical current density Jc at 77 K. and 1T of the wire was 10,000 $A/cm^2$ or more at a wire core thickness of 0.05 mm. When the core thickness exceeds 500 $\mu$m, the orientation or texture was lost, and when the thickness was below 2 $\mu$m, no current value satisfactory for the conductor was reached. Preferred core thickness is in the range of 10 to 100 $\mu$m.

EXAMPLE 3

A method of producing the metal sheathed wire of the present invention, and the superconductivity of the wire will be in detail described below.

Powders of 99.9% pure $Y_2O_3$, $BaCO_3$ and CuO were mixed in a Y:Ba:Cu atomic ratio of 1:2:3 and fired in an oxygen gas stream at 930° C./5 hr. The resulting powder was formed in pellets and fired under the same conditions to make the pellets superconductive.

These pellets were pulverized and then charged to have a density of 2.7 $g/cm^3$ into a gold-5 wt % palladium alloy-made pipe of 6 mm in outer diameter, 5 mm in inner diameter and 400 mm in length. Both the ends of the pipe were sealed. The wire material was drawn through a drawbench to form a wire of 2.8 mm in outer diameter and then rolled to form a tape-shaped wire of 0.1 to 0.5 mm in thickness and 1 to 5 m in length.

The thus obtained tape-shaped wire was subjected to the heat treatment as described below.

Figure 3:
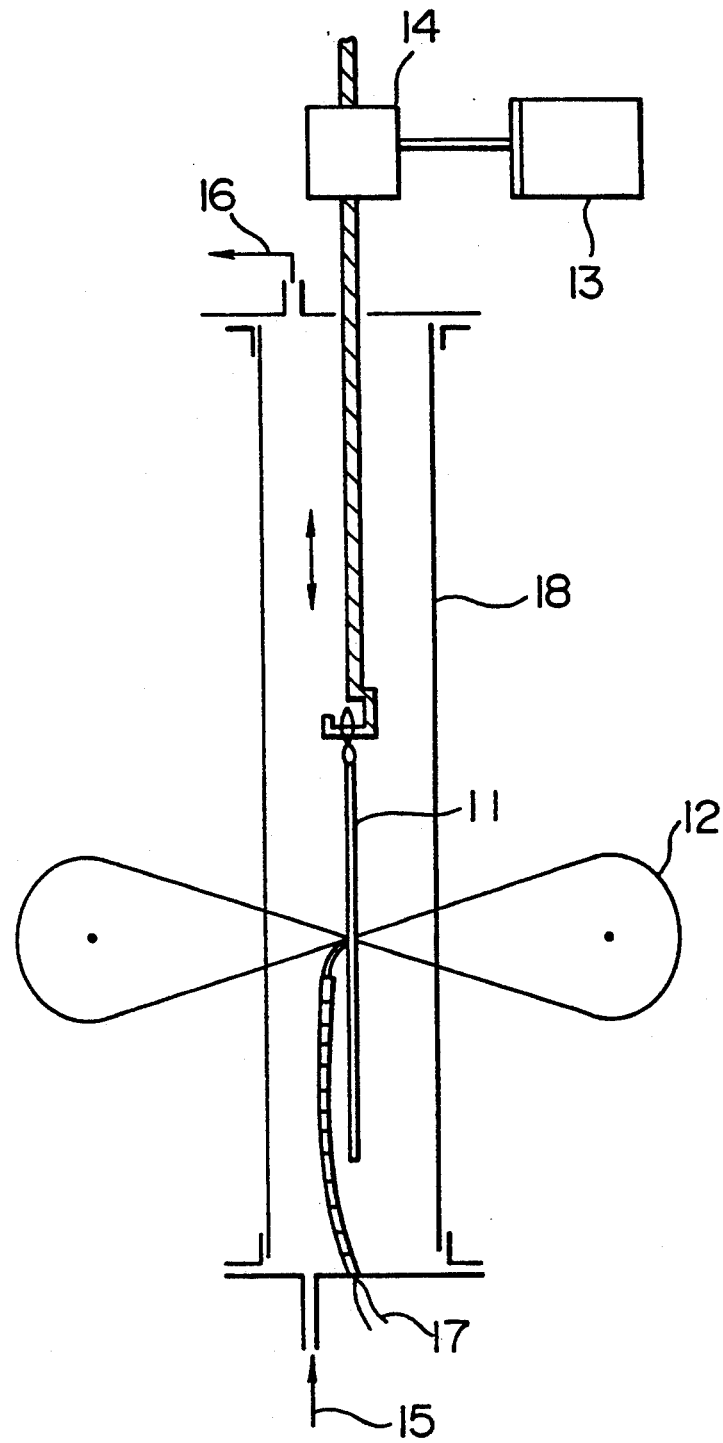
FIG. 3 is a diagrammatical view explaining a method of producing a wire of the oxide superconductor for use in a high magnetic field according to the present invention.

The heat treating apparatus used in this example is schematically shown in FIG. 3. This apparatus was a local infrared ray-concentration heating apparatus 12. Sample 11 was vertically supported and heated uniformly in the width direction and the thickness direction and with a large or sharp gradient of temperature in the longitudinal direction. In this example, an infrared ray was used but a carbon dioxide laser may be used as a heat source. The heating zone had a size of 100 mm in width and 2 mm in length. The sample was movable up and down by a motor 13 and a power-transmitting means 14. The sample was heated from the bottom thereof to the top at a rate of 3 to 6 mm per hour. This apparatus was provided with an oxygen-charging inlet 15 at the bottom thereof and an oxygen-discharging outlet 16 at the top thereof, and also with a thermocouple 17 monitoring the temperature. The heat treating atmosphere was isolated from air by a transparent quartz glass tube 18.

Figure 4:
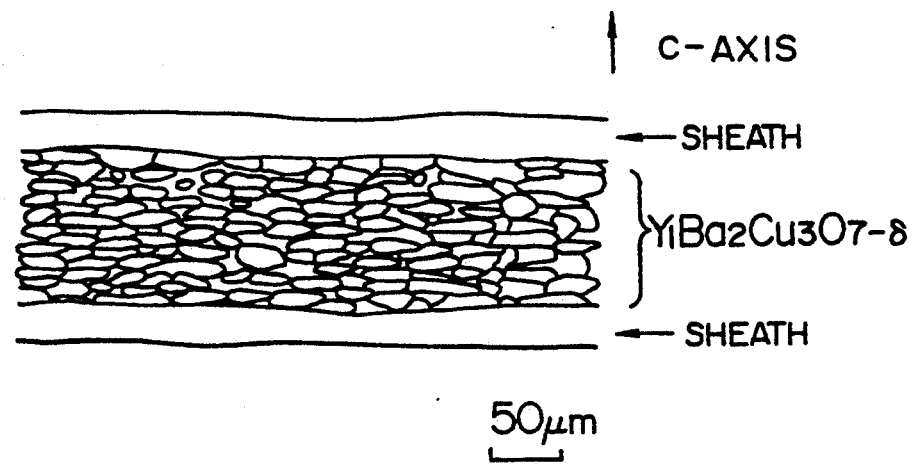
FIG. 4 is a diagrammatical view illustrating the cross-sectional microstructure of the comparative material in Example 3.
Figure 5:
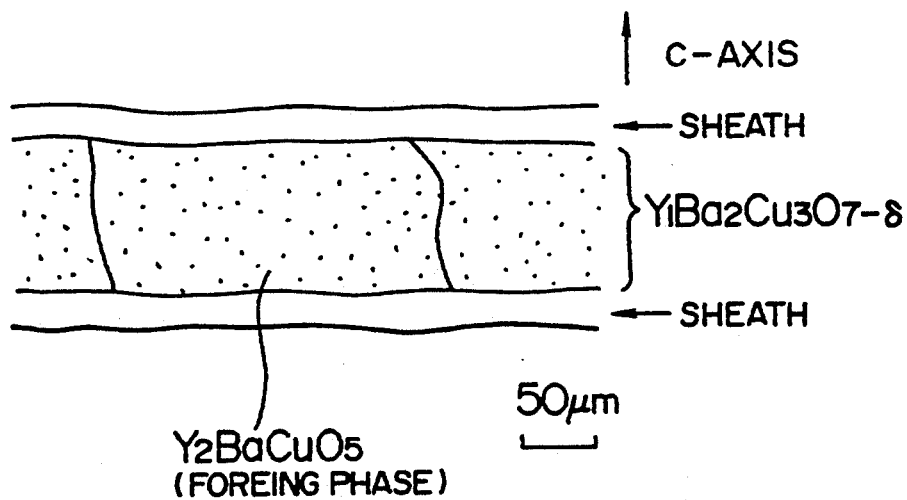
FIG. 5 is a diagrammatical view illustrating the cross-sectional microstructure of the superconductor according to the present invention in Example 3.

The heat treatment was carried out at 950° to 1,100° C. in such a manner that the heating zone was in parallel with the plane of the tape and perpendicular to the longitudinal direction of the tape. After the heat treatment, the tape was annealed in an oxygen stream at 400° C. for 100 to 300 hours and then evaluated for the superconductivity. The tape-shaped wire used was of 0.1 to 0.5 mm in thickness, 5 mm in width and 100 to 200 mm in length. The cross-sectional structure of the thus obtained wire were observed for a comparative sample (FIG. 4) nd of the present invention (FIG. 5). FIG. 4 is a diagrammatical view of the cross section of the oxide superconductor filled in a silver pipe and heat treated at 980° C. This superconductor had a critical current density Jc of 100 $A/cm^2$ at 1T. On the other hand, FIG. 5 is a diagrammatical view of the cross section of the oxide superconductor heat treated at 1070° C. This superconductor had a critical current density Jc of 15,000 $A/cm^2$ at 1T.

The superconductors as shown in FIGS. 4 and 5 had a c-plane oriented crystal structure, but the comparative one had a lowered Jc because it had the grain boundaries in the thickness direction.

EXAMPLE 4

The powder of $Tl_2Ba_2Ca_2Cu_3O_{10}$ prepared by a solid-phase reaction in the same manner as in EXAMPLE 3 was formed in a film on an MgO (100) single crystal substrate by a screen printing technique. The film may be formed by laser deposition, sputtering, plasma spraying or the like. The thickness of the film was in the range of 30 to 100 $\mu$m. The film was heat treated in the same manner as in EXAMPLE 3. The heat treating temperature was in the range of 900° to 1,000° C. The size of the substrate was of 5 mm in width, 0.5 mm in thickness and 20 mm in length.

Figure 6:
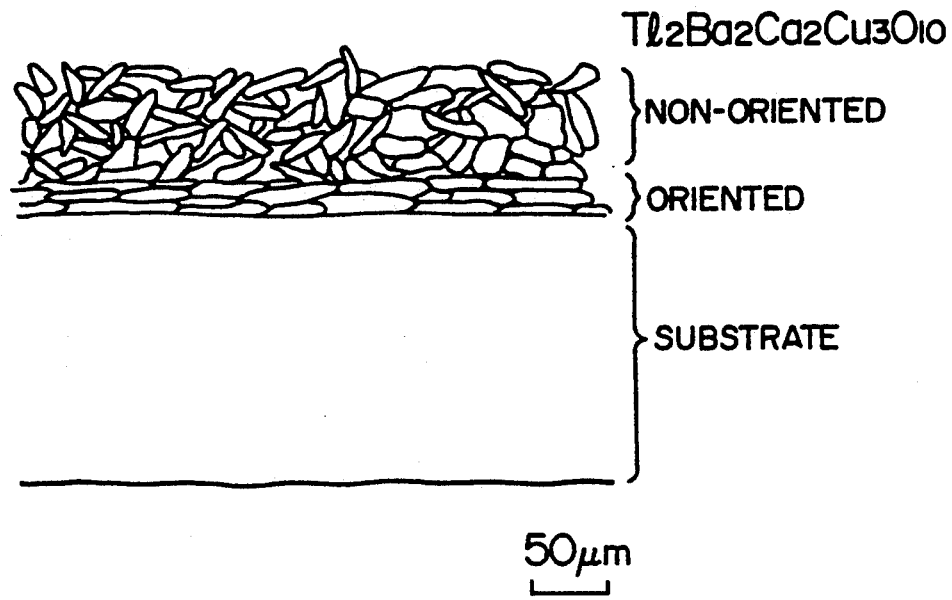
FIG. 6 is a diagrammatical view illustrating the cross-sectional microstructure of the comparative material in Example 4.
Figure 7:
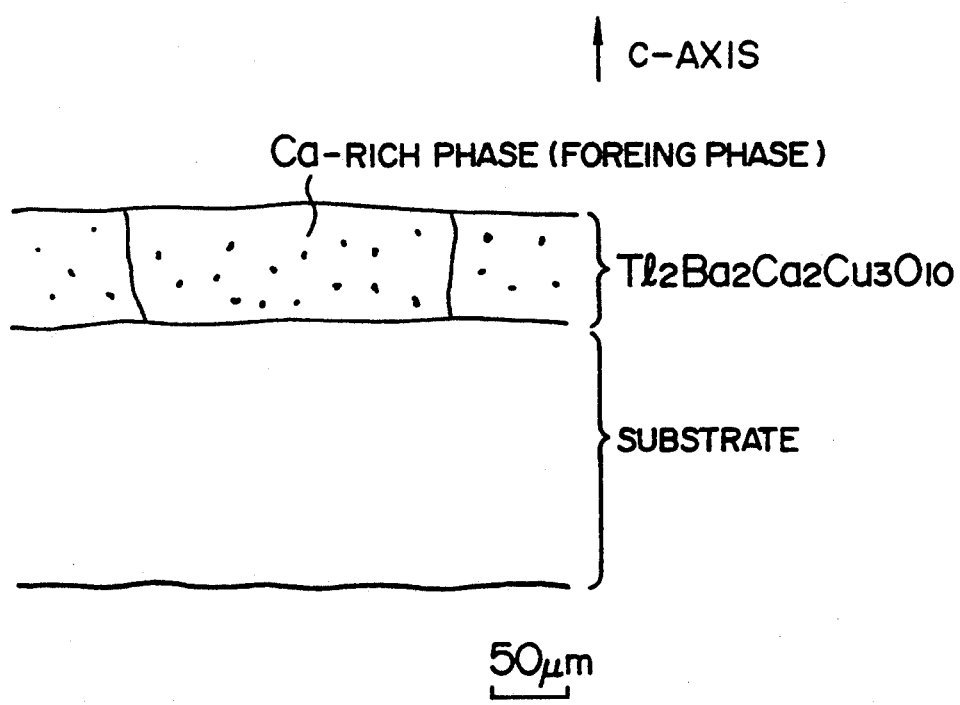
FIG. 7 is a diagrammatical view illustrating the cross-sectional microstructure of the superconductor according to the present invention in Example 4.

The cross-sectional structure of this sample according to the present invention is shown in FIG. 7 and that of a comparative sample is shown in FIG. 6. The sample of FIG. 6 was heat treated at 900° C. and that of FIG. 7 at 980° C. The comparative sample of FIG. 6 had oriented crystals on the surface of the substrate but non-oriented crystals apart from the surface. On the other hand, the sample of FIG. 7 according to the present invention had no grain boundaries in the thickness direction. The former had a critical current density Jc of 30 $A/cm^2$ and the latter had a Jc of 12,000 $A/cm^2$ at 1T.

EXAMPLE 5

Figure 8:
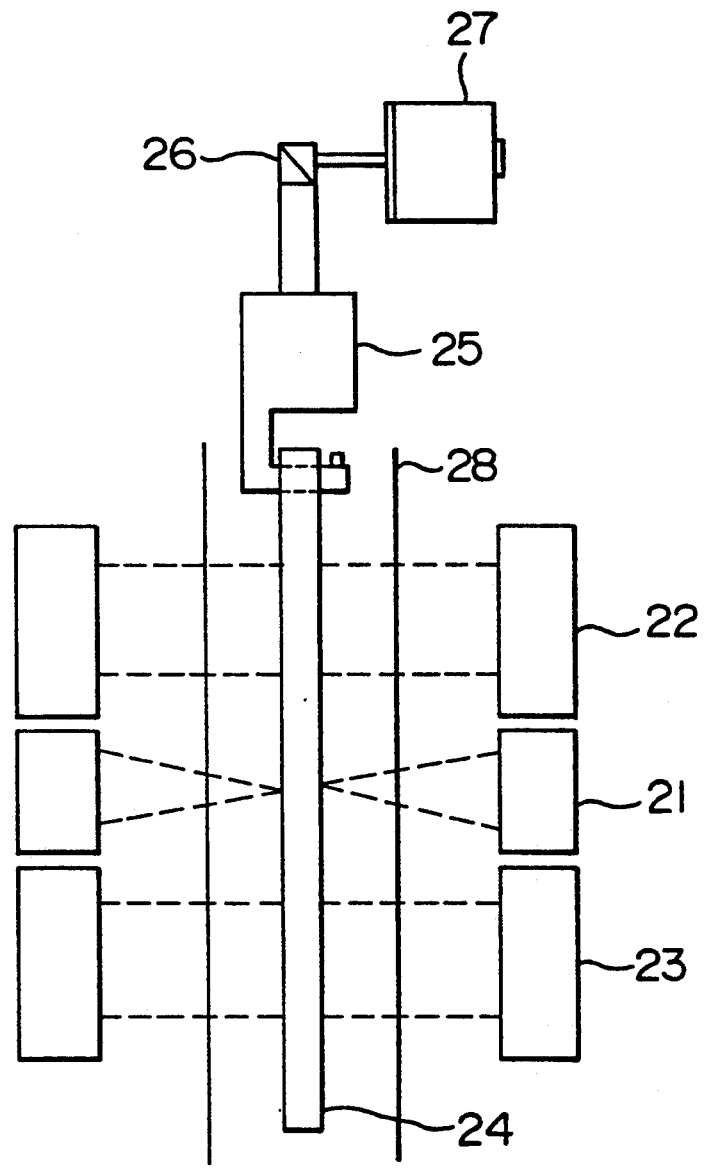
FIG. 8 is a diagrammatical view illustrating another apparatus for local heating.

Powders of 99.9% pure barium carbonate ($BaCO_3$), calcium carbonate ($CaCO_3$) and cupric oxide (CuO) were mixed in a Ba:Ca:Cu atomic ratio of 2:2:3 in a mortar and pestle for 30 minutes, and then fired in an oxygen stream at 900° C. for 5 hours. To this powder was added 99.9% pure thallium oxide ($Tl_2O_3$) so that the molar ratio of Tl:Ba:Ca:Cu was 2:2:2:3. The powder was mixed in a planetary centrifugal ball mill for 2 hours (hereinafter referred to as Powder No. 1). Part of this mixed powder was fired in air at 845° C. for 2 hours and then pulverized in a mortar and pestle for 30 minutes (hereinafter referred to as Powder No. 2). These starting powders were charged into a silver pipe, a gold pipe and a silver pipe having a nickel coating of 1 mm thick applied thereon (a silver/nickel double pipe). These pipes were of 6 mm in outer diameter, 5 mm in inner diameter and 1,000 mm in length. These pipes were then sealed and drawn with a drawbench to form a wire of 2.8 mm in outer diameter. Part of this wire was rolled by a four-stage cold-rolling mill having a roll of 110 mm in diameter to form a wire having a flat-shaped cross-sectional structure of 5 mm in width, 0.1 to 0.5 mm in thickness and 2 to 5 m in length. The thus obtained wire was cut in a length of 200 mm and subjected to the localized heat treatment in another local heating apparatus as shown in FIG. 8.

The localized heat treatment was made in a local linear light-concentration type infrared-ray image furnace 21 (a light-concentrated region of 3 mm in a longitudinal direction and 100 mm in a traverse direction). The length subjected to the localized heat treatment is up to 10 mm, preferably up to 5 mm in the longitudinal direction. Furthermore, the furnace was equipped with infrared-ray heaters 22 and 23 (heated region of 100 mm × 100 mm) as auxiliary heater above and below the light-concentrating portion. The sample temperature was measured with a platinum thermocouple welded directly onto the wire. The thermocouple signal for controlling heaters 21, 22 and 23 was obtained by fixing the same original sample wire as used in each experiment as a dummy sample in the vicinity of the original sample wire and measuring the temperature of the dummy sample with a platinum thermocouple. The temperature error between the dummy sample and the original sample varies depending upon the kind of metal sheath materials but it was at most within ±7° C. The wire 24 was fixed to a quartz glass-made sample holder 25 which was movable upwardly and downwardly at a constant speed by a power-transmitting means 26 and a driving motor 27. The sample was isolated from air by a quartz glass tube 28. The heat treatment was carried out in an oxygen stream at a flow rate of 200 ml/hr.

The wires used in the examples above are shown in Table 1. The conditions of the experiments and the critical current densities Jc at 77 K. and 1T are shown in Table 2. Comparative Wire No. 20 in Table 2 was not subjected to the localized heating but to uniform heating, and this wire was compared with Wire No. 6. The Jc was measured by the four-terminal method and defined as being a current when 1 $\mu V$ was generated at a distance of 1 cm between the terminals.

TABLE 1

| No. | Powder | Sheath | Cross-Sectional Contour | Thickness |
|---|---|---|---|---|
| 1 | 1 | Au | round | 2.8 mm |
| 2 | 2 | Au | round | 2.8 |
| 3 | 1 | Ag | flat | 0.5 |
| 4 | 1 | Au | flat | 0.5 |
| 5 | 1 | Ag/Ni | flat | 0.5 |
| 6 | 1 | Ag/Ni | flat | 0.25 |
| 7 | 1 | Ag/Ni | flat | 0.1 |
| 8 | 2 | Ag | flat | 0.5 |
| 9 | 2 | Au | flat | 0.5 |
| 10 | 2 | Ag/Ni | flat | 0.5 |
| 11 | 2 | Ag/Ni | flat | 0.25 |
| 12 | 2 | Ag/Ni | flat | 0.1 |

TABLE 2

| No. | Sample No. of Table 1 | Heating Temp. (°C.) | Transferring Rate (mm/hr) | Jc (77K, 1T) (A/cm$^2$) |
|---|---|---|---|---|
| 1 | 1 | 900 | 3 | 20 |
| 2 | 2 | 900 | 3 | 90 |
| 3 | 3 | 900 | 3 | 900 |
| 4 | 4 | 900 | 3 | 1,800 |
| 5 | 5 | 900 | 3 | 4,500 |
| 6 | 6 | 900 | 3 | 6,800 |
| 7 | 7 | 900 | 3 | 10,030 |
| 8 | 8 | 900 | 3 | 700 |
| 9 | 9 | 900 | 3 | 1,530 |
| 10 | 10 | 900 | 3 | 2,500 |
| 11 | 11 | 900 | 3 | 3,300 |
| 12 | 12 | 900 | 3 | 8,530 |
| 13 | 4 | 850 | 3 | 20 |
| 14 | 4 | 875 | 3 | 1,050 |
| 15 | 4 | 925 | 3 | 1,880 |
| 16 | 4 | 950 | 3 | 400 |
| 17 | 6 | 900 | 6 | 6,500 |
| 18 | 6 | 900 | 12 | 3,700 |
| 19 | 6 | 900 | 18 | 2,300 |
| 20 | 6 | 900 | uniformly heated | 100 |

From the results as shown above it is seen that Powder No. 1 is more effective for the heat treatment of the present invention than Powder No. 2. Furthermore, the flat-shaped wire has a tendency to exhibit a higher critical current density Jc than that of the round-shaped wire. The thinner the thickness of the wire, the stronger the tendency becomes. It is also seen that an Ag/Ni sheath is the best one, and the heat treating temperature is preferred to be in the range of 875° to 925° C., preferably 900° C. This is because the melting point of the thallium-containing superconductor is 890° C. With the known oxide superconductors, bismuth-containing superconductors and yttrium-containing superconductors, it is preferred that the heat treating temperature is higher by 100° C. or lower, preferably 50° C. or lower, than the respective melting points of the superconductors. For example, it is preferably 1,000° to 1,100° C. for the yttrium-containing superconductors and 880° to 900° C. for the bismuth-containing superconductors.

The relationship of the gradient of temperature in a longitudinal direction with the orientability and critical current density Jc is shown in Table 3. The orientation is represented by the volume percentage of oxide crystals having the c-plane oriented at an angle within ±5° in the width direction of the wire, based on the total of the crystals.

TABLE 3

| No. | Gradient of Temp. (°C./mm) | Orientation (%) | Density (%) | Jc (77K, 1T) (A/cm$^2$) |
|---|---|---|---|---|
| 3 | 40 | 77 | 99 | 900 |
| 4 | 52 | 89 | 99 | 1,800 |
| 5 | 57 | 92 | 98 | 4,500 |
| 6 | 61 | 95 | 98 | 6,800 |
| 7 | 65 | 97 | 98 | 10,030 |
| 17 | 61 | 91 | 99 | 6,500 |
| 18 | 57 | 90 | 98 | 3,700 |
| 19 | 55 | 88 | 98 | 2,300 |
| 20 | 0 | 0 | 98 | 100 |

From the results as shown above, there is found a clear correlation between the gradient of temperature and the orientation. In order to obtain a good orientation, it is seen that a gradient of temperature is required to be at least 50° C./mm. The gradient of temperature is greatly dependent upon the optical absorptivity of the metal sheath. The orientability has a tendency to be reduced in the order of a nickel sheath having the highest absorptivity, gold sheath and silver sheath. However, since nickel is highly reactive to the oxide superconductor, the double layered sheath of an outer nickel layer and an inner layer of less Ni-reactive silver in contact with the oxide superconductor is preferred in the present invention. Less reactive sheath materials such as silver may be covered with a deposited or plated coating of a highly light-absorbing material such as nickel. The present invention may employ light-heating sources of stronger energy other than carbon dioxide laser and xenone lamp.

EXAMPLE 6

Next, the procedures of preparing the oxide superconductor of the present invention and the comparative oxide superconductor will be explained below. The oxide superconductor used was a thallium-containing oxide superconductor having a thallium:barium:strontium:calcium:copper:oxygen atomic ratio of 2.0:1.6:0.4:2.0:3.0:10. Firstly, barium carbonate, strontium carbonate, calcium carbonate and copper oxide were mixed and prefired in an oxygen atmosphere at 900° C. for 5 hours. The prefired body was pulverized and then a predetermined amount of thallium was added. The mixture was pelletizd in pellets of 30 mm in diameter, which were fired in a covered alumina crucible at 870° C. for 2 hours. Thereafter, these pellets were ground and again pelletized and then fired at 870° C. for 3 hours. The thus obtained superconductor had a superconductivity-transition temperature of 120 K. and a density of 5.0 g/cm$^3$. These pellets were used for comparison.

Next, the procedures of preparing the superconductor of the present invention will be explained below. Part of the pellets for comparison as obtained above was pulverized and charged into a silver-5% palladium alloy-made pipe of 6 mm in outer diameter, 5 mm in inner diameter and 400 mm in length, which pipe was closed at one end thereof. Thereafter, the charged pipe was drawn with a drawbench to form a wire of 1.0 mm in outer diameter, which was subjected to the intermediate annealing at 500° C. for 15 minutes and then rolled to form a tape-shaped wire of 0.3 mm in thickness. Part of this tape was cut in strips of 40 mm in length, which were fired in oxygen at 860° C. for 2 hours and again pressed to form a tape of 0.15 mm in thickness. These strips were repeatedly subjected to the firing-pressing-firing cycle under the same conditions to form a tape-shaped superconductor of 0.1 mm in thickness and 5 mm in width.

The cross-sectional structure of the thus obtained wires was observed to contain foreign phases with the comparative wire and clear grain boundaries, whereas the structure of the superconductor according to the present invention was observed to contain no grain boundaries and further contain very fine foreign phases such as voids finely and uniformly dispersed therein. Measurements of the superconductivities of these wires are shown in FIGS. 9, 10, 11 and 12. The critical current density was measured by a usual four-terminal method and defined as being a current when a terminal voltage of 1 $\mu$V was generated. The magnetization curve was measured with a sample-vibrating type magnetometer. The average size and the grain boundary-occupying surface area were measured by an optical microscope and a scanning electron microscope.

Figure 9:
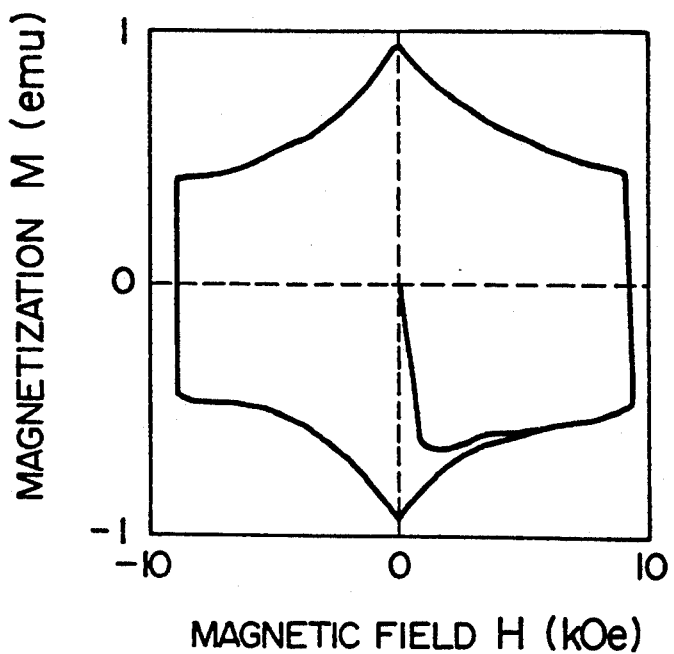
FIG. 9 is a graph showing a magnetization curve at 77 K. of the superconductor according to the present invention and the wire thereof.
Figure 10:
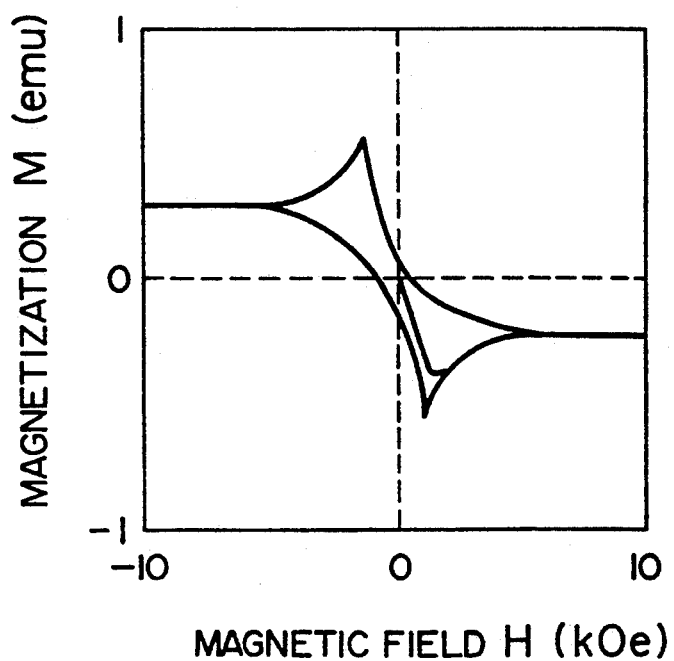
FIG. 10 is a graph showing a magnetization curve at 77 K. of the comparative material.
Figure 11:
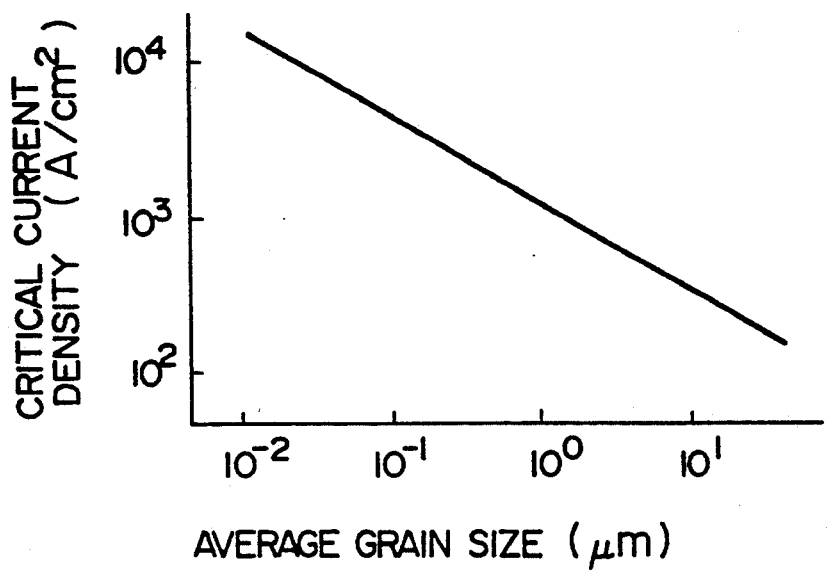
FIG. 11 is a graph showing a relationship between the critical current density at 77 K. of the superconductor and wire according to the present invention and the average particle size of the different phase at the grain boundaries.
Figure 12:
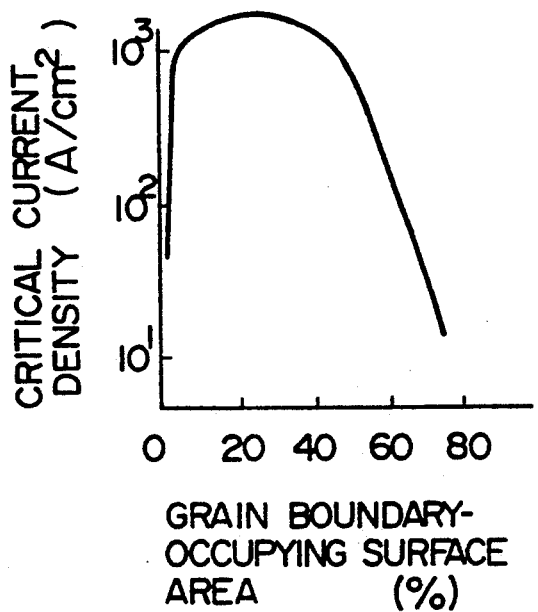
FIG. 12 is a graph showing a relationship between the critical current density at 77 K. of the superconductor and wire according to the present invention and the surface area rate occupied by the different phase at the grain boundaries.

FIG. 9 shows the magnetization curve of the superconductor according to the present invention. From FIG. 9 it is seen that the superconductor according to the present invention has high magnetization characteristics. To the contrary, the comparative superconductor has poor magnetization characteristics, as seen from FIG. 10. Furthermore, it is clear from FIG. 11 that the larger the average size of the foreign phases at the grain boundaries, the smaller the critical current density. When the average size is 0.1 $\mu$m or less, the critical current density is about 10$^3$ A/cm$^2$ or more. Furthermore, the critical current density varies depending upon the foreign phase-occupying surface area at the grain boundaries to a large extent. As shown in FIG. 12, the critical current density is 10$^2$ A/cm$^2$, when the occupying surface area at the grain boundaries is 1 to 50%. These characteristics vary depending upon the kind of oxide superconductors, but it is clear that the average size and occupying surface area of the foreign phases have a great effect on the characteristics.

There have never been found any examples of the oxide superconductors exhibiting such a high critical current density as shown above. The features of the superconductor according to the present invention are the unique magnetization characteristics as shown in FIG. 9 in addition to the unique fine structure. That is, the magnetic field is unclear, except for the initial magnetization curve, due to a bonding current of a high current density which flows between crystal grains.

Materials for the metal sheath include not only the above-mentioned silver-5% palladium alloy, but also a material having some hardness and good electric and thermal conductivity, such as a gold-7% palladium alloy and copper-0.5 to 10% aluminum alloy.

EXAMPLE 7

Examples of procedures for making superconducting coils using the oxide superconductors according to the present invention will be illustrated below.

The same composition of the oxide superconductor and the same procedures of producing the wire as in EXAMPLE 6 were used.

Figure 13:
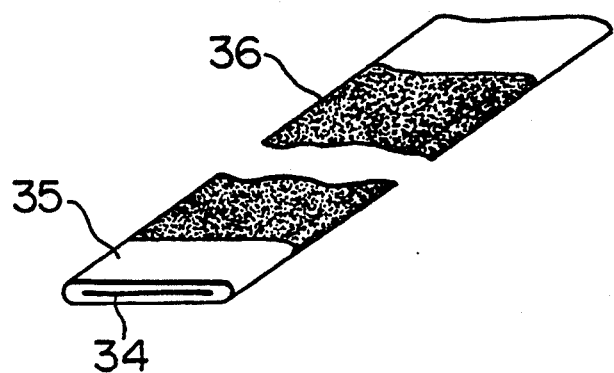
FIG. 13 is a perspective view illustrating the structure of the superconducting wire according to an embodiment of the present invention.
Figure 14:
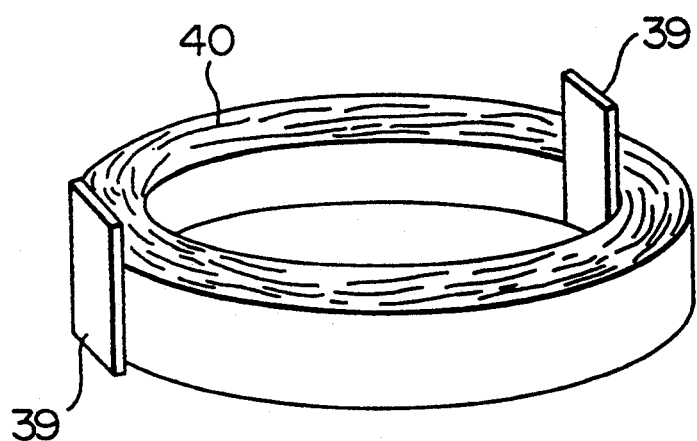
FIG. 14 is a perspective view illustrating a coil made from the superconductor according to the present invention.
Figure 15:
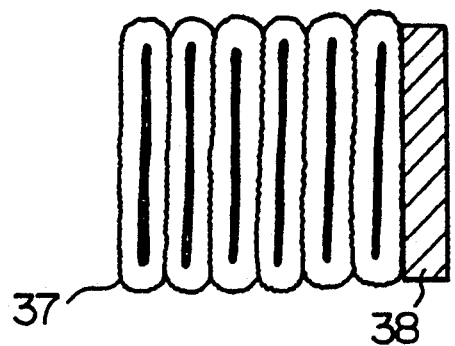
FIG. 15 is a cross-sectional view of the insulation structure of the superconducting coil according to the present invention.

On the surface of the tape-shaped superconductor wire 34 of 0.1 mm in thickness, 5 mm in width and 5 m in length, which was obtained in Example 6 was applied a nickel plating 36 of 50 microns thick from a usual Watt's bath (a nickel-electroplating liquid), except for the electrodes 35 at the ends of the wire. The appearance of the plated wire is shown in FIG. 13. Thereafter, the wire was wound around a pancake type coil as shown in FIGS. 14 and 15. The bore diameter was 30 mm.

In this case, a winding core 38 made of a silver-5% palladium alloy and of 20 mm in inner diameter, 30 mm in outer diameter and 5 mm in axis-length, was used. The nickel plating was not applied on the tape-shaped wire over a length of 9 cm at the end of the wire. The winding core was directly in contact with the wire at the nickel-plating free region. Five of the thus obtained unit coils were subjected to the heat treatment in an oxygen stream at 870° C. for 2 hours to sinter the oxide superconductor and at the same time form a nickel oxide insulating film 37 between the wound wires. Furthermore, the metal sheath of the wire and the winding core were fused to each other at the connections thereof.

FIG. 16 shows a perspective view of the wire, the cross-sectional structure of the resultant coil. Six of these coils were stacked as shown in FIG. 16. Insulating alumina plates (insulating spacers) 42 of 0.5 mm thick were placed between the coils. The six coils were thus integrated and provided with electrodes. The integrated coil was again subjected to the final heat treatment in an oxygen stream at 870° C. for 2 hours. Then, lead wires 41 were provided. This coil generated a magnetic field of 0.05T at 77 K. and a magnetic field of 0.1T at 20 K.

EXAMPLE 8

Next, a pancake type coil as shown in FIG. 16 was made in the same manner as in EXAMPLE 7. In the present example was used a $Bi_2$-$Sr_2$-$Ca_2$-$Cu_3$-$O_{10}$ system oxide superconductor. Four of Tl oxide type coils used in Example 7, and two coils of Bi oxide type coils were prepared. Two Bi oxide type coils were stacked and electrically connected to each other in opposite winding direction as shown in FIG. 16. In the same way, two sets of Tl oxide type unit coils were prepared. Then the coil device shown in FIG. 16 was assembled which consists of three coil units. The upper coil unit and the lower oil unit are made of Tl oxide type superconductor and the intermediate coil unit is made of Bi oxide type superconductor. Since the strip or tape of Tl oxide type coils has little anisotropy with respect to transmitting direction of magnetic flux between the direction parallel with the plane of the strip or tape and the direction perpendicular to the plane of the strip or tape, Tl oxide type coil units should be put on the outside where magnetic field forms magnetic flux flowing not only along the plane of the strip, but also in such direction as to transverse the plane. On the other hand, Bi oxide type coil unit which has anisotropy and has a small transmitting capacity along the plane perpendicular to the plane of the strip should be put in the intermediate position so that the magnetic capacity of the coil device can be increased. A current was allowed to pass through these coils at 77 K. to generate a magnetic field of 0.08T. An external bias magnetic field of 0.05T was applied to increase the maximum magnetic field generated to 0.1T.

When a current was allowed to pass through a coil of the oxide superconductor to generate a magnetic field, the magnitude of the magnetic field and the direction may vary depending upon the positions in the coil.

In an example of a cylindrical solenoid coil, the magnetic field was the strongest at the center of the innermost coil and the weakest at the circumference and the ends of the solenoid coil. The direction of the magnetic field was longitudinal at the center but predominantly radial at the ends.

In the oxide superconductor there is found a dependency of the critical current density upon the direction of a magnetic field, which is contributed to by the crystal structure. For example, in the relationship between the critical current density of a tape-shaped wire of a Bi-Sr-Ca-Cu-0 system oxide superconductor and the magnetic field, it is seen that the critical current density is more greatly reduced when the magnetic field is normal to the tape plane than when the magnetic field is in parallel with the tape plane. Therefore, the coil of such wire has a large magnetic field component normal to the tape and a smaller critical current density at the ends of the coil.

In order to eliminate such drawbacks as mentioned above, the coil of the present invention uses a wire capable of maintaining the critical current density even in the direction of magnetic field at the ends of the coil. In other words, the dimension of the coil is selected taking an account of the direction of magnetic field at the ends of the coil, or a bias magnetic field-generating means is provided outside to reduce the amount of the components in the direction of magnetic field of the coil windings. Alternatively, a superconductor wire having a small dependency upon the direction of magnetic field may be used at the ends of the coil. The oxide superconductor according to the present invention may be used in the form of the composite comprising the superconductor and a metal sheath or a substrate, or in the form of the superconductor by itself.

What is claimed is:

1. A high-temperature oxide superconductor wire which comprises a long normally electrically conductive sheath and a high-temperature oxide superconductor densely charged into said sheath, said oxide superconductor being polycrystalline, said oxide superconductor consisting essentially of oxide crystals having opposed major surfaces, the opposed major surfaces substantially all extending in the longitudinal direction, said oxide superconductor containing a controlled amount of a non-superconducting phase and weak superconducting phase in the grains of the crystals and the grain boundaries of the crystals, and said grain boundaries forming a superconducting strong bond the superconductor wire having only a single layer of oxide crystal grains in the thickness direction.

2. A high-temperature oxide superconductor composite according to claim 1, wherein the normally electrically conductive sheath is double-layered, having an outer nickel layer and an inner layer comprising silver.

3. A high-temperature oxide superconductor wire according to claim 1, formed by a process comprising steps of:

forming a heating zone with a sharp gradient of temperature in the longitudinal direction of said wire, the longitudinal direction and a width direction of the wire, traverse to the longitudinal direction, defining a wide plane of the wire, and melting part or the whole of the heated part of said oxide superconductor, while transferring said heating zone in the longitudinal direction, to provide flat oxide crystals and to orient the flat plane of substantially all of the flat oxide crystals in parallel with the wide plane of said wire.

4. The high-temperature oxide superconductor wire according to claim 1, wherein a surface area of grain boundaries of the oxide crystals taken up by non-superconducting or weak superconducting phases is 1–50% of the total surface area of the grain boundaries.

5. A high-temperature oxide superconductor wire which comprises a long normally electrically conductive sheath and a high-temperature oxide superconductor densely charged into said sheath, said oxide superconductor being polycrystalline, said oxide superconductor consisting essentially of oxide crystals, the oxide crystals having opposed major surfaces extending in the longitudinal direction, and said oxide superconductor being substantially free of a non-superconducting phase and weak superconducting phase in at the grain boundaries of the crystals, the superconductor wire having only a single layer of oxide crystal grains in the thickness direction.

6. A high-temperature oxide superconductor composite comprising an oxide superconductor on a substrate, the oxide superconductor being polycrystalline, the composite being formed by a method comprising the steps of:

depositing an oxide of said high-temperature oxide superconductor on a substrate to prepare a wire having a flat cross-sectional contour, the wire extending in a longitudinal direction and having a width in a traverse direction to the longitudinal direction and a thickness in a direction perpendicular to the longitudinal direction and width direction, and subjecting said wire to localized heating to heat said wire approximately uniformly in the traverse direction and with a sharp gradient of temperature in the longitudinal direction, while transferring said wire in the longitudinal direction, so as to form grains of oxide superconductor that substantially all have major opposed surfaces extending in the longitudinal and width directions and not in the thickness direction, the superconductor wire having only a single layer of oxide crystal grains in the thickness direction.

7. The high-temperature oxide superconductor composite according to claim 6, wherein said substrate is made of a metal or a ceramic.

8. The high-temperature oxide superconductor composite according to claim 7, wherein said substrate is made of a material selected from the group consisting of silver, gold, palladium, alloys of two or more thereof, magnesia, yttria and stabilized zirconia.

9. A high-temperature oxide superconductor composite comprising an oxide superconductor in a sheath, the oxide superconductor being polycrystalline, the composite being formed by a method comprising the steps of:

charging oxide powers of the high-temperature oxide superconductor into a metal sheath pipe, the metal sheath pipe extending in a longitudinal direction, pressing said oxide powders and said metal sheath pipe to increase the packing density of the oxide powders, and subjecting the packed oxide compact via said sheath pipe to localized heating with a sharp gradient of temperature in the longitudinal direction, from one side of said compact, while transferring said oxide compact in the longitudinal direction, and cooling said compact, so as to form grains of oxide superconductor that substantially all have major opposed surfaces extending in the longitudinal direction and in a second direction perpendicular to the longitudinal direction and not in a third direction perpendicular to the longitudinal and second directions, the composite having only a single layer of oxide crystal grains in the thickness direction.

10. A high-temperature oxide superconductor wire which comprises a long normally electrically conductive sheath and a high-temperature oxide superconductor densely charged into said sheath, the oxide superconductor being polycrystalline, the superconductor wire having a flat-shaped cross-sectional structure, the wire extending in a longitudinal direction and having a width direction perpendicular to said longitudinal direction and to a thickness direction of the wire, grains of the oxide superconductor having opposed major surfaces perpendicular to a c-axis which is in the thickness direction, with grain boundaries between major surfaces of adjacent grains of oxide crystals constituting said superconductor being present only in the longitudinal direction and the width direction, and the crystal grains being bonded to each other at grain boundaries so that each crystal is in parallel in a c-plane, perpendicular to the c-axis, with the other crystals, the superconductor wire having only a single layer of oxide crystal grains in the thickness direction.

11. The high-temperature oxide superconductor wire according to claim 10, wherein the c-axis of said oxide crystals is in parallel with the thickness direction of said wire.

12. The high-temperature oxide superconductor wire according to claim 10, wherein the angle made between the c-axis of the said oxide crystals and the c-axis of the adjacent oxide crystals in within 5°.

13. The high-temperature oxide superconductor wire according to claim 10, wherein the thickness of the oxide crystals is in the range of 2-500 μm.

14. The high-temperature oxide superconductor wire according to claim 10, wherein a thickness of the oxide crystal grains constituting the superconductor is in the range of 2-500 μm.

15. A high-temperature oxide superconductor wire which comprises a long normally electrically conductive sheath and a high-temperature oxide superconductor densely charged into said sheath, the oxide superconductor being polycrystalline, the wire extending in a longitudinal direction and having a width direction perpendicular to said longitudinal direction and to a thickness direction of the wire, the oxide superconductor being composed of grains of oxide crystal, the wire having only a single layer of oxide crystal grains in the thickness direction wherein the thickness of the oxide crystal grains constituting the superconductor is in the range of 2-500 μm.

16. The high-temperature oxide superconductor wire according to claim 15, wherein the grains of oxide crystal have opposed major surfaces, the opposed major surfaces extending in the longitudinal and width directions.

17. The high-temperature oxide superconductor wire according to claim 15, wherein the crystal grains of the oxide crystals are bonded to each other at grain boundaries so that each crystal is in parallel in a c-plane with the other crystals.

18. A high-temperature oxide superconductor wire which comprises a long normally electrically conductive sheath and a high-temperature oxide superconductor densely charged into said sheath, the oxide superconductor being polycrystalline, the wire extending in a longitudinal direction and having a width direction perpendicular to said longitudinal direction and to a thickness direction of the wire, wherein the oxide superconductor is composed of grains of oxide crystals and having only a single layer of the oxide crystals in the thickness direction.

19. The high-temperature oxide superconductor wire according to claim 18, wherein the grains of oxide crystal have opposed major surfaces, the opposed major surfaces extending in the longitudinal and width directions.

20. The high-temperature oxide superconductor according to claim 18, wherein the crystal grains of the oxide crystals are bonded to each other at grain boundaries so that each crystal is in parallel in a c-plane with the other crystals.

21. A high-temperature oxide superconductor wire which comprises a long normally electrically conductive sheath and a high-temperature oxide superconductor densely charged into said sheath, the oxide superconductor being polycrystalline, the wire extending in a longitudinal direction and having a width direction perpendicular to said longitudinal direction and to a thickness direction of the wire, the oxide superconductor being composed of grains of oxide crystal, wherein all grains, of the grains of oxide crystal, are bonded to adjacent grains at grain boundaries that extend substantially in a direction of a c-axis of the oxide crystals, the superconductor wire having only a single layer of oxide crystal grains in the thickness direction.

22. The high-temperature oxide superconductor wire according to claim 21, wherein a direction of the c-axis of adjacent oxide crystals deviates from each other by an amount of less than 5°.

23. The high-temperature oxide superconductor wire according to claim 21, wherein the oxide crystals have a thickness in the range of 2 μm to 500 μm.

* * * * *